(12) United States Patent
Hong

(10) Patent No.: US 7,323,385 B2
(45) Date of Patent: Jan. 29, 2008

(54) METHOD OF FABRICATING FLASH MEMORY DEVICE

(75) Inventor: Young Ok Hong, Kyeongki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 142 days.

(21) Appl. No.: 11/294,915

(22) Filed: Dec. 6, 2005

(65) Prior Publication Data

US 2006/0194385 A1 Aug. 31, 2006

(30) Foreign Application Priority Data

Feb. 28, 2005 (KR) .................... 10-2005-0016431

(51) Int. Cl.
*H01L 21/336* (2006.01)
(52) U.S. Cl. ...................... 438/262; 438/586
(58) Field of Classification Search ............... 438/262, 438/586

See application file for complete search history.

(56) References Cited

U.S. PATENT DOCUMENTS

| 2002/0060334 A1 | 5/2002 | Shukuri et al. ............. 257/306 |
| 2006/0194385 A1 | 8/2006 | Hong ........................ 438/243 |
| 2007/0238286 A1* | 10/2007 | Kwon ........................ 438/627 |

FOREIGN PATENT DOCUMENTS

| JP | 2006-245538 | 9/2006 |
| KR | 2001-0077260 | 8/2001 |

* cited by examiner

*Primary Examiner*—Jack Chen
(74) *Attorney, Agent, or Firm*—Marshall, Gerstein & Borun LLP

(57) ABSTRACT

A method of fabricating flash memory devices includes the steps of forming a stop nitride film and an oxide film on a semiconductor substrate having a predetermined structure formed therein, forming trenches in the oxide film and the stop nitride film, forming barrier oxide films on lateral faces of the trenches by an atomic layer deposition method, and forming bit lines within the trenches.

4 Claims, 2 Drawing Sheets

METHOD OF FABRICATING FLASH MEMORY DEVICE

BACKGROUND OF THE INVENTION

1. Field of the Invention

The invention relates generally to a method of fabricating flash memory devices and, more specifically, to a method of fabricating flash memory devices, in which oxidization of a tungsten hard mask film can be prevented and bit line capacitance can be reduced.

2. Discussion of Related Technology 70 nm-grade NAND flash devices are currently fabricated as follows. Gate and source/drain junctions are first formed, and a first interlayer insulation film is formed on the entire surface of a substrate. A source contact that is electrically connected to the source junction through the first interlayer insulation film is formed, and a second interlayer insulation film is formed on the entire surface. A drain contact that is electrically connected to the drain junction through the first and second interlayer insulation films is formed, and a stop nitride film and an oxide film are formed on the entire surface. The oxide film and the stop nitride film are etched to form a trench through which the second interlayer insulation film on the drain contact and the source contact are exposed. A contact hole through which the source contact is formed in the second interlayer insulation film is exposed through the formation of the trench. A cleaning process is then performed and a metal material such as tungsten (W) is buried into the trench and the contact hole to form a bit line connected to the drain contact and a source line connected to the source contact.

In such a scheme, the oxide film is lost due to the cleaning process. A wet barrier is added to the lateral sides of the trench in order to prevent loss of the oxide film.

Meanwhile, to prevent defective patterns of the oxide film due to damage of a photoresist (PR) used to etch the trench, a tungsten hard mask film is used. The tungsten hard mask film partially remains even after the trench is etched.

In the case where an oxide film by a typical low-pressure chemical vapor deposition (LPCVD) method is used as the wet barrier, however, a problem arises because a residual tungsten hard mask film is oxidized. To prevent this problem, a nitride film is used as the wet barrier instead of the oxide film.

Since the nitride film has a dielectric constant higher than that of the oxide film, however, problems arise because bit line capacitance increases and the bit line speed is reduced.

SUMMARY OF THE INVENTION

The invention provides a method of fabricating flash memory devices, in which oxidization of a tungsten hard mask film is prevented and bit line capacitance is reduced, thus enhancing the bit line's speed.

A method of fabricating flash memory devices according to an aspect of the invention includes the steps of forming a stop nitride film and an oxide film on a semiconductor substrate having a predetermined structure formed therein, forming trenches in the oxide film and the stop nitride film, forming barrier oxide films on lateral faces of the trenches by an atomic layer deposition (ALD) method, and forming bit lines within the trenches.

A method of fabricating flash memory devices according to another aspect of the invention includes the steps of forming a first interlayer insulation film on a semiconductor substrate in which gate and source/drain junctions are formed, forming a source contact electrically connected to the source junction through the first interlayer insulation film, forming a second interlayer insulation film on the first interlayer insulation film and forming a drain contact electrically connected to the drain junction through the second and first interlayer insulation films, laminating a stop nitride film and an oxide film on the entire surface including the second interlayer insulation film, forming trenches through which the second interlayer insulation film and the drain contact on the source contact are exposed in the stop nitride film and the oxide film, forming barrier oxide films on lateral faces of the trenches by an ALD method, forming a contact hole through which the source contact is exposed in the second interlayer insulation film below the trenches, performing a cleaning process, and burying the trenches and the contact hole with a metal film, forming bit lines connected to the drain contact and source lines connected to the source contact.

DETAILED DESCRIPTION OF PREFERRED EMBODIMENTS

Preferred embodiments according to the invention are described below with reference to the accompanying drawings. Since preferred embodiments are provided for the purpose that persons of ordinary skill in the art are able to understand the invention, they may be modified in various manners and the scope of the invention is not limited by the preferred embodiments described below.

Figure 1A:
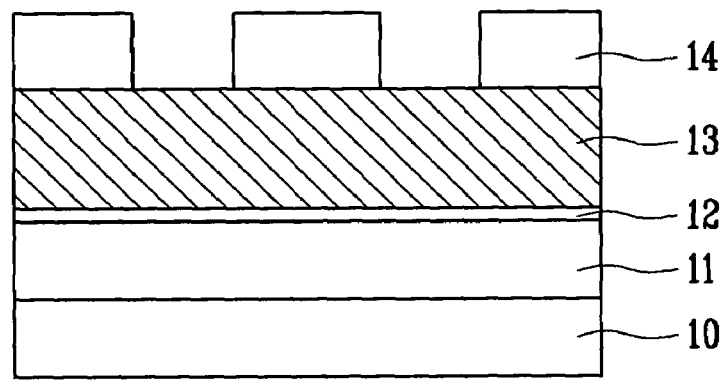
FIGS. 1a to 1c are sectional views illustrating a method of fabricating flash memory devices according to an embodiment of the invention.
Figure 1B:
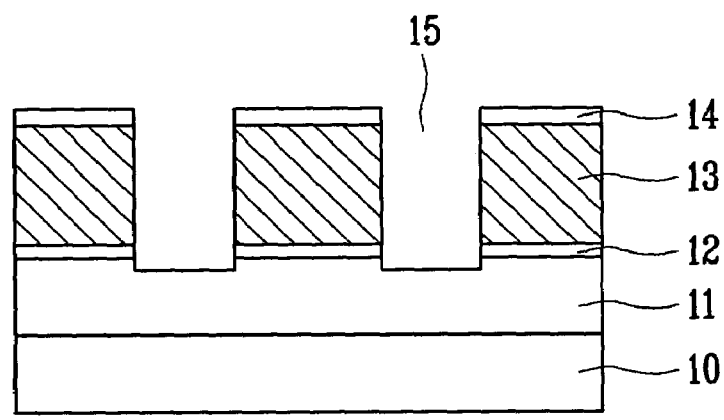
Figure 1C:
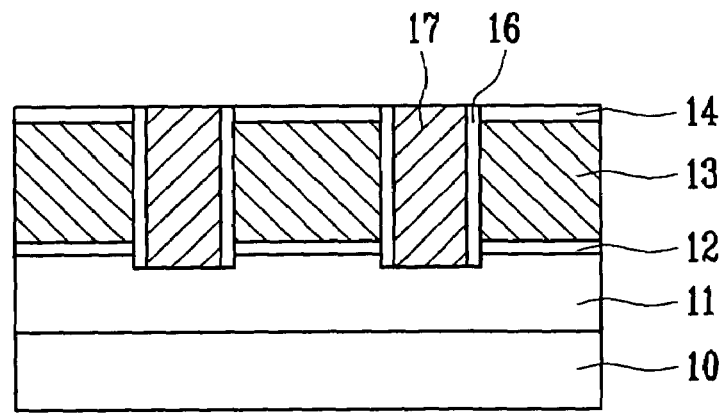

FIGS. 1a to 1c are sectional views for illustrating a method of fabricating flash memory devices according to an embodiment of the invention.

As shown in FIG. 1a, a second interlayer insulation film 11 is first formed on a semiconductor substrate 10 on which a process of forming gate and source/drain junctions of a flash memory device, a process of forming a first interlayer insulation film on the entire surface and the process of a source contact electrically connected to the source junction through the first interlayer insulation film are performed. A drain contact (not shown) electrically connected to the drain junction through the second interlayer insulation film 11 and the first interlayer insulation film is formed.

A stop nitride film 12 and an oxide film 13 are then formed on the entire surface including the second interlayer insulation film 11.

A tungsten hard mask film 14 is formed on the oxide film 13. The tungsten hard mask film 14 is patterned by a photolithography process.

As shown in FIG. 1b, the oxide film 13 and the stop nitride film 12 are etched using the patterned tungsten hard mask film 14 as a mask, forming trenches 15 through which the drain contact is exposed.

Though not shown in the drawing, the oxide film 13 and the stop nitride film 12 on the source contact are also etched to form trenches through which the second interlayer insulation film 11 on the source contact is exposed.

When etching the oxide film 13 and the stop nitride film 12 for forming the trenches 15, the tungsten hard mask film 14 is also etched. Since tungsten has an etch selectivity which is different from that of each of the oxide film and the nitride film, the tungsten hard mask film 14 is not fully etched, but remains on the oxide film 13 to a predetermined thickness.

As shown in FIG. 1c, an atomic layer deposition (ALD) oxide film is formed on the entire surface including the trenches 15 by an ALD method. The ALD oxide film is etched back to form barrier oxide films 16 on lateral faces of the trenches 15. The barrier oxide films 16 can be formed to a thickness of 30 Å to 70 Å.

The barrier oxide films 16 function to prevent loss of the oxide film 13 due to a cleaning process performed after a contact hole is formed. The ALD method does not cause oxidization of the residual tungsten hard mask film 14 unlike other oxide film formation processes such as low-pressure chemical vapor deposition (LPCVD). Furthermore, since the barrier oxide films 16 have capacitance lower than that of the nitride film, bit line capacitance can be kept low.

Some of the second interlayer insulation film 11 exposed through the formation of the trenches 15 is selectively etched to form a contact hole (not shown) through which the source junction formed in the semiconductor substrate 10 is exposed. A cleaning process is then performed.

Thereafter, a metal film such as tungsten (W) is deposited on the entire surface so that the contact hole and the trenches 15 are fully buried. The entire surface is etched back or undergoes chemical mechanical polishing (CMP) so that the oxide film 13 is exposed, forming bit lines 17 connected to the drain contact and source lines (not shown) connected to the source contact.

The method of fabricating the flash memory devices according to an embodiment of the invention is thereby completed.

Figure 2:
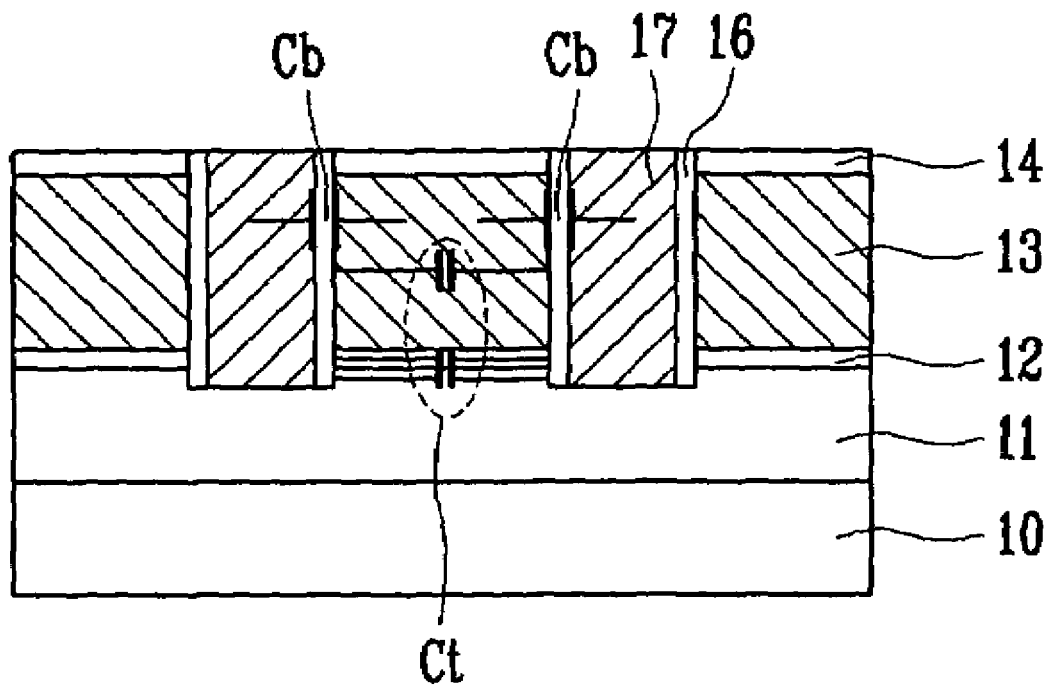
FIG. 2 is a view for illustrating a bit line capacitance reduction effect of the flash memory devices fabricated according to the invention.

FIG. 2 is a view for illustrating a bit line capacitance reduction effect of the flash memory devices fabricated according to the present invention. Inter-bit line capacitance is indicated by $C_t$, $C_b$.

Assuming that the whole capacitance when the wet barrier for preventing loss of the oxide film during the cleaning process is an oxide film barrier (the present invention) is $C_o$, the whole capacitance when the wet barrier is a nitride film barrier (prior art) is $C_n$, and barrier capacitance is $C_{bn}$, capacitance can be expressed in the following equations.

$$\frac{1}{C_n} = \frac{2}{C_{bn}} + \frac{1}{C_t}$$

$$C_n = \frac{(C_{bn} * C_t)}{(C_{bn} + 2C_t)}$$

$$\frac{1}{C_o} = \frac{2}{C_{bo}} + \frac{1}{C_t}$$

$$C_o = \frac{(C_{bo} * C_t)}{(C_{bo} + 2C_t)}$$

-continued

As a result, $$C_n - C_o = \frac{C_t^2 * (C_{bn} - C_{bo})}{[(C_{bn} - 2C_t) * (C_b - 2C_t)]}$$

Meanwhile, since $$C_{bn} = 1.87 C_{bo},$$

$$C_n - C_o = \frac{C_t^2 * 0.87 C_{bo}}{(4C_t^2 + 2C_t * 2.87 C_{bo} + 1.87 C_{2b}^2)} > 0$$

If the ALD oxide film barrier is used as the wet barrier as in the present invention, the bit line capacitance can be reduced by $C_n$-$C_o$.

As described above, in accordance with the invention, since a wet barrier is formed using an oxide film having capacitance lower than that of a nitride film, bit line capacitance can be reduced. As a result, the bit line speed can be improved.

In addition, since an oxide film barrier is formed by an ALD method, oxidization of a tungsten hard mask film can be prevented.

Although the foregoing description has been made with reference to the preferred embodiments, it is to be understood that changes and modifications of the invention may be made by the ordinary skilled in the art without departing from the spirit and scope of the invention and appended claims.

What is claimed is:

1. A method of fabricating flash memory devices, comprising the steps of:
    forming a stop nitride film and an oxide film on a semiconductor substrate having a predetermined structure formed therein;
    forming trenches defining lateral faces in the oxide film and in the stop nitride film;
    forming barrier oxide films on the lateral faces of the trenches by an atomic layer deposition method; and
    forming bit lines within the trenches.

2. The method as claimed in claim 1, wherein the step of forming the trenches comprises the steps of:
    forming a tungsten hard mask film on the oxide film;
    patterning the tungsten hard mask film; and
    etching the oxide film and the stop nitride film using the patterned tungsten hard mask film as a mask.

3. The method as claimed in claim 1, further comprising the steps of:
    forming a contact hole through which a source contact of the predetermined structure is exposed after the barrier oxide films are formed; and
    performing a cleaning process.

4. The method as claimed in claim 1, wherein the barrier oxide films have a thickness of 30 Å to 70 Å.

* * * * *